United States Patent [19]

Noren

[11] Patent Number: 4,600,050

[45] Date of Patent: Jul. 15, 1986

[54] HEAT EXCHANGER

[76] Inventor: Don W. Noren, 846 Blandford Blvd., Redwood City, Calif. 94062

[21] Appl. No.: 727,588

[22] Filed: Apr. 26, 1985

[51] Int. Cl.$^4$ ............................................ F28D 15/00
[52] U.S. Cl. ........................... 165/104.14; 165/104.33; 361/384
[58] Field of Search ...................... 165/104.33, 104.14, 165/104.34; 361/384

[56] References Cited

U.S. PATENT DOCUMENTS 4,303,122 12/1981 Powell ............................ 165/104.14

FOREIGN PATENT DOCUMENTS

| 2915712 | 10/1980 | Fed. Rep. of Germany | 165/104.14 |
| 21441 | 2/1978 | Japan | 165/104.33 |
| 116038 | 9/1978 | Japan | 165/DIG. 12 |

OTHER PUBLICATIONS

"Cooler Handles Heat in Long, Closed Cabinets", Article in Electronic Products, Jun. 6, 1983, pp. 30, 32.

"HP-3600 Series Heat Exchangers", Brochure of McLean Midwest Corp., 1982.

*Primary Examiner*—Albert W. Davis, Jr.
*Attorney, Agent, or Firm*—Fay, Sharpe, Fagan, Minnich & McKee

[57] ABSTRACT

A heat exchanger assembly for cooling the interior of a closed cabinet containing electronic components or the like includes a finned heat pipe core. The core has a plurality of spaced heat pipes positioned in at least two rows and a plurality of spaced fins which are provided with colinear apertures through which each of the plurality of heat pipes can extend. The heat pipes are secured to the fins. A member is provided for securing the finned heat pipe core to an associated cabinet. A pair of fans are provided, one being operatively connected with each end of the finned heat pipe core. One of the fans and an associated first end of the heat pipe core is in contact only with air inside the associated closed cabinet while the other of the fans and an associated second end of the finned heat pipe core is in contact only with the ambient air outside the cabinet. The fins have a spacing and a thickness which is sized to fit the performance curve of the fans.

14 Claims, 8 Drawing Figures

CAPACITY (CUBIC FEET PER MINUTE)
FAN CURVE OF 4 11/16 TUBE AXIAL FAN

HEAT EXCHANGER

BACKGROUND OF THE INVENTION

This invention generally pertains to heat exchangers. More specifically, the present invention relates to a heat exchanger assembly which includes a plurality of heat pipes for cooling the interior of a closed cabinet.

The invention is particularly applicable to heat exchanger used in the cooling of electronic equipment in hostile industrial environments. However, it will be appreciated by those skilled in the art that the invention has braoder applications and may also be adapted for use in many other environments where the cooling of a sealed cabinet is important.

As is well-known, heat transfer occurs in a heat pipe by means of a phase change in the fluid—from liquid to vapor and then from vapor back to liquid. a thin-skinned cylindrical shell of a suitable heat conducting metal, such as copper, encloses a wick and a suitable fluid. as heat is applied to an evaporator end of the heat pipe, the fluid is vaporized and travels to the condenser end thereof. As the vapor condenses, it gives up its latent heat of vaporization. Now back in the liquid state, the fluid returns to the evaporator end of the heat pipe via a capillary action along the wick lined walls of the pipe. At the evaporator end, the fluid is again reheated and vaporized.

Conventional heat pipes have been used to transfer heat in many different applications. For example, one known heat exchanger utilizes a plurality of heat pipes to remove heat from a sealed enclosure. As is well-known, heat exchangers differ from air conditioners in that they cannot cool an enclosure below the ambient temperature. But where the ambient air is not excessively hot (not above approximately 125° F.) or moisture laden, a heat exchanger can be used to transfer heat from inside a hot closed enclosure to the environment surrounding it.

In general, heat transfer between the interior of a closed chamber and its environment through a bank of heat pipes and fins and with air driven by fans is quite complex and extremely difficult to describe mathematically. This is so since a phase change takes place in the working fluid of the heat pipe, there is a turbulent flow of air around the bank of heat pipes and fins caused by the fans and the heat transfer takes place through convection between the working fluid and the heat pipe walls, conduction between the heat pipes and fins, as well as through forced convection, as the fan blows air around the heat pipes and fins.

In the known heat exchanger, a plurality of heat pipes and fins are provided in a large box which is adapted to be bolted onto an enclosure and two separate air circulation systems, each using two blowers, are used to transfer the heat from the enclosure to the outside. Heat from the air inside the cabinet is absorbed by the bottom half of the heat pipe core and ambient air is used to draw heat from the top of the core. This conventional assembly is quite large, however, weighting approximately 73 pounds and measuring $36\frac{3}{4}$ inches high, 7 inches deep and 19 inches wide.

For cooling small cabinets filled with electronic equipment, such as circuit boards, no suitable heat exchanger has been available and thus fans and filters have generally had to be used. A simple downsizing of known heat exchangers to the size necessary for use in small cabinets would not be adequate since such an exchanger would not be capable of transferring a sufficient amount of heat out of the enclosure. Also, in the development of finned heat pipe assemblies for small enclosures, conventional formulas could not be called on to determine the correct sizes of the heat pipes and the fins in relation to the types of fans used, to ensure that a sufficiently large amount of heat could be transferred out of the sealed enclosure.

Accordingly, it has been considered desirable to develop a new and improved heat exchanger assembly which would overcome the foregoing difficulties and others and meet the above stated needs while providing better and more advantageous overall results.

BRIEF SUMMARY OF THE INVENTION

In accordance with the present invention, a new and improved heat exchanger assembly is provided for cooling the interior of a closed cabinet containing electronic components or the like.

More particularly in accordance with the invention, the heat exchanger assembly includes a finned heat pipe core having a plurality of spaced heat pipes positioned in at least one row and a plurality of spaced fins which are provided with colinear apertures through which each of the plurality of heat pipes can extend. The heat pipes are secured to the fins. Affixing means are also provided for securing the heat pipe core to an associated cabinet. Also provided are a pair of fans, one being operatively connected with each end of the finned heat pipe core. One of the fans and an associated first end of the heat pipe core is positioned to be in contact with only the air inside the associated closed cabinet. The other of the fans and an associated second end of the finned heat pipe core is positioned to be in contact with only the ambient air outside of the associated cabinet. The fins have a spacing and a thickness which is sized to fit the performance curve of the fans.

In accordance with another aspect of the invention, fourteen fins are provided per inch of heat pipe length. Preferably, each fin is approximately 0.008 inches thick.

According to another aspect of the invention, eight heat pipes are provided in two rows of four each. Preferably, the heat pipe rows are offset from each other. Preferably also, the heat pipes extend approximately 11 inches in length.

According to a further aspect of the invention, the securing means includes a container structure in which the finned heat pipe core is held and to which the two fans are secured. The securing means also includes a flange structure to which the container structure is secured. The flange structure closes an appropriately sized aperture in the associated container. The securing means further comprises a plurality of fasteners for securing the flange structure to the associated container. Preferably, the flange structure is approximately $5\frac{1}{4}$ inches square and the container with the two fans is approximately $11\frac{1}{2}$ inches long and $4\frac{3}{8}$ inches high.

In accordance with a still further aspect of the invention, the assembly further comprises seal means for sealing the associated cabinet and preventing air flow between the ends of the heat pipe to prevent heat transfer between the associated cabinet and the environment except through the finned heat pipe core. The seal means preferably includes an epoxy layer.

According to still another aspect of the invention, the fans are each 30 watt fans and have a capacity of approximately 100 CFM (cubic feet per minute).

According to yet another aspect of the invention, the finned heat pipe core and the pair of fans are capable of transferring over 200 watts of heat when the temperature inside the associated cabinet is approximately 20° C. above the ambient temperature.

One advantage of the present invention is the provision of a new heat exchanger assembly which can be used with small sealed enclosures to cool equipment inside the enclosures while the equipment remains isolated from the hostile environment surrounding it.

Another advantage of the invention is the provision of a heat exchanger using a finned heat pipe core and a pair of fans wherein the fins of the heat pipe core have a spacing and a thickness which is sized to fit the performance curve of the fans to ensure that the maximum amount of heat possible can be transferred by the finned heat pipe core.

A further advantage of the invention is the provision of a small heat exchanger which can transfer over 200 watts of heat when the temperature inside a small cabinet meant to be cooled is approximately 20° C. above the ambient temperature.

Still other benefits and advantages of the invention will become apparent to those skilled in the art upon a reading and understanding of the following detailed specification.

BRIEF DESCRIPTION OF THE DRAWINGS

The invention may take physical form in certain parts and arrangements of parts, a preferred embodiment of which will be described in deatil in this specification and illustrated in the accompanying drawings which form a part hereof, and wherein.

DETAILED DESCRIPTION OF THE PREFERRED EMBODIMENT

Figure 2:
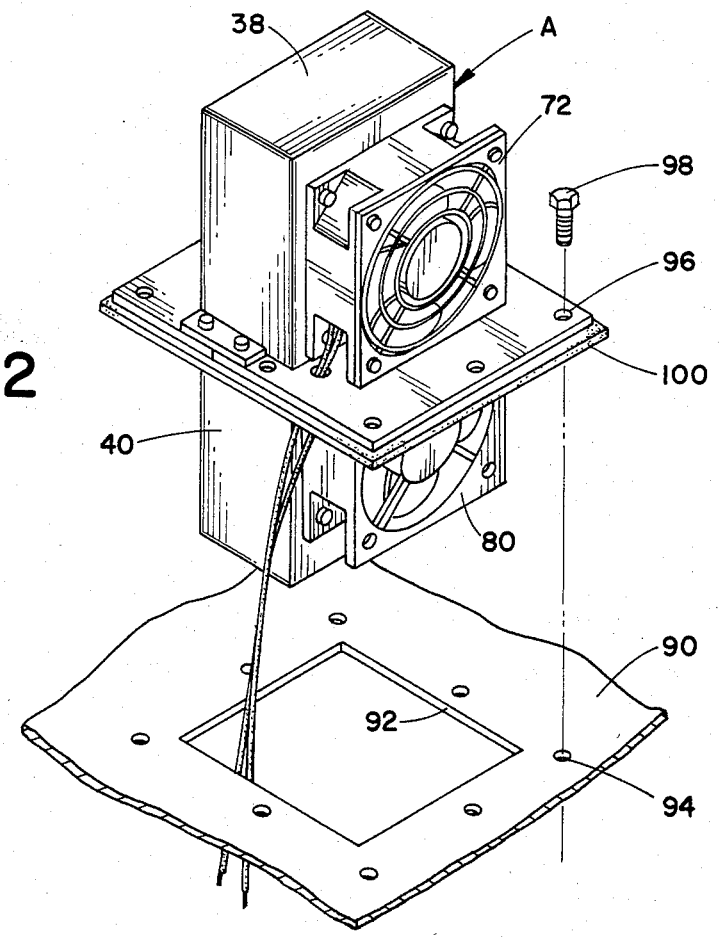
FIG. 2 is a perspective view of the heat exchanger assembly of the present invention.

Referring now to the drawings, wherein the showings are for purposes of illustrating a preferred embodiment of the invention only and not for purposes of limiting same, FIG. 2 shows the subject new heat exchanger A. While the heat exchanger is primarily designed for and will hereinafter be described in connection with cooling electronic circuitry in small cabinets, it will be appreciated that the overall inventive concept involved could be adapted for use in other environments as well.

Figure 5:
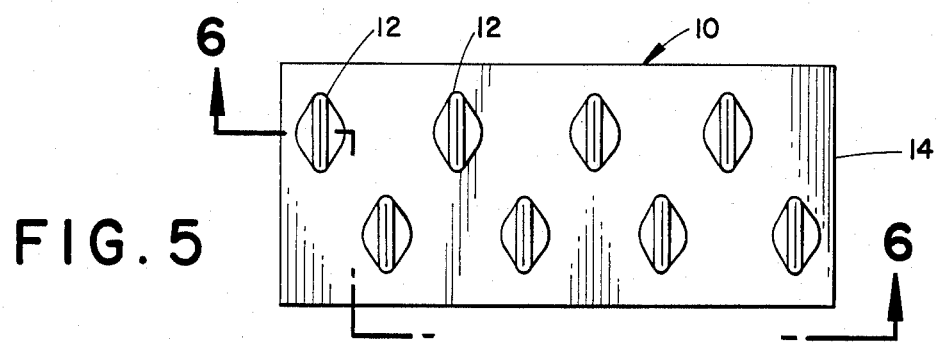
FIG. 5 is an enlarged top plan view of a finned heat pipe core of FIG. 4.
Figure 6:
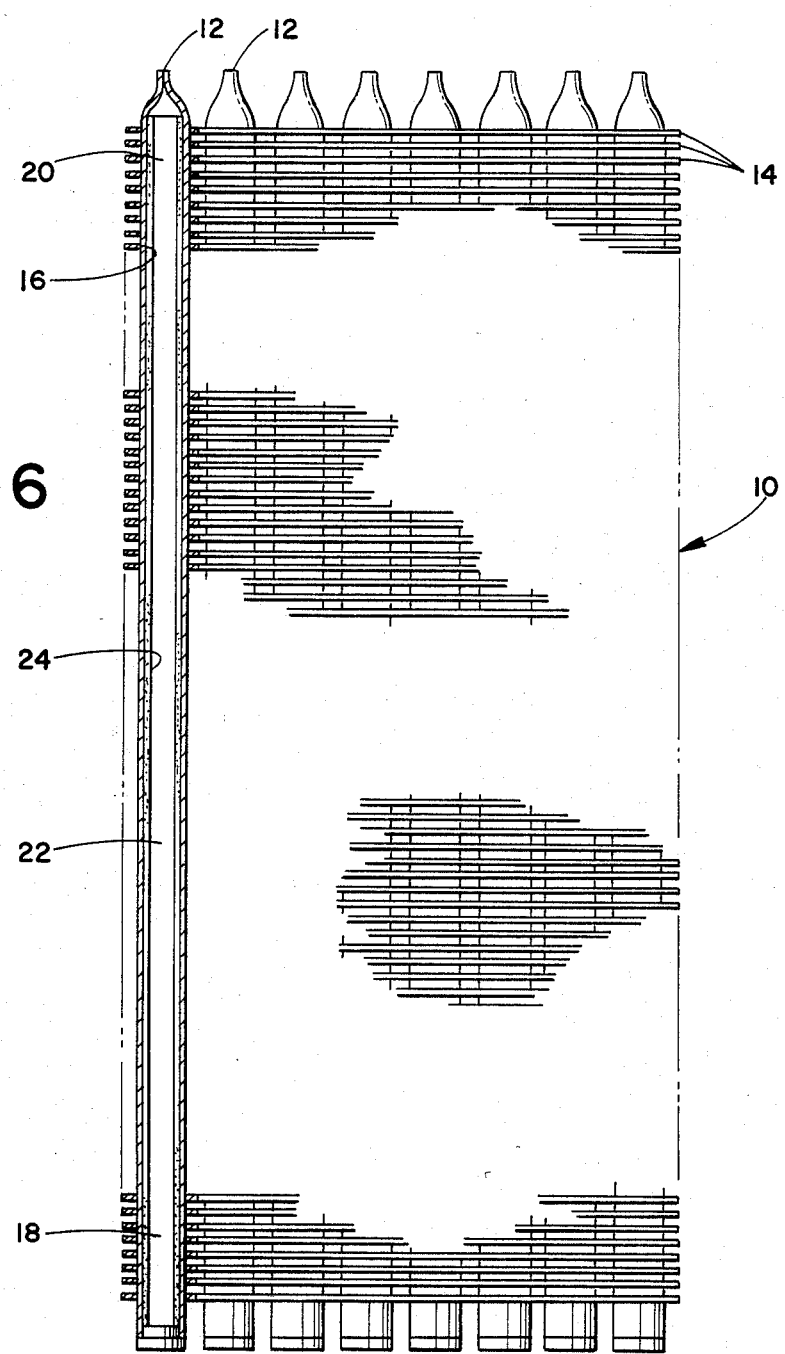
FIG. 6 is a side elevational view, in partial cross section and partially broken away, of the finned heat pipe core of FIG. 5.

With reference now also to FIG. 6, the heat exchanger A of the present invention includes a finned heat pipe core 10 which is comprised of a plurality of heat pipes 12 and fins 14. Preferably, two rows of four heat pipes each are provided with one of the rows being offset from the other row as shown in FIG. 5. Each of the eight heat pipes 12 extends through all of the plurality of fins 14 through suitable apertures 16 provided therein. The heat pipes are preferably formed from a copper material or the like and are expanded after being positioned in the respective apertures 16 so that they become tightly bound to the fins 14. Such tight binding is also necessary in order to ensure that the heat pipes are able to transmit heat by conduction to the fins 14, which are preferably made from aluminum. Of course, other materials could be used for the heat pipes and fins.

The heat pipes each include an evaporator end 18 and a condenser end 20 as well as a hollow interior 22 in which is positioned a wick structure 24 extending from the evaporator end 18 to the condenser end 20. A suitable vaporizable fluid is placed in each heat pipe 12 in an amount slightly in excess of that required to completely wet the wick. Thereafter, the pipe is partially evacuated and sealed.

Preferably, the heat pipes are on the order of 11 inches long and the fins are each 2 inches wide and 5 inches long. Preferably also, approximately fourteen fins are provided per inch of heat pipe length. The fins are preferably 0.008 inches in width.

Figure 4:
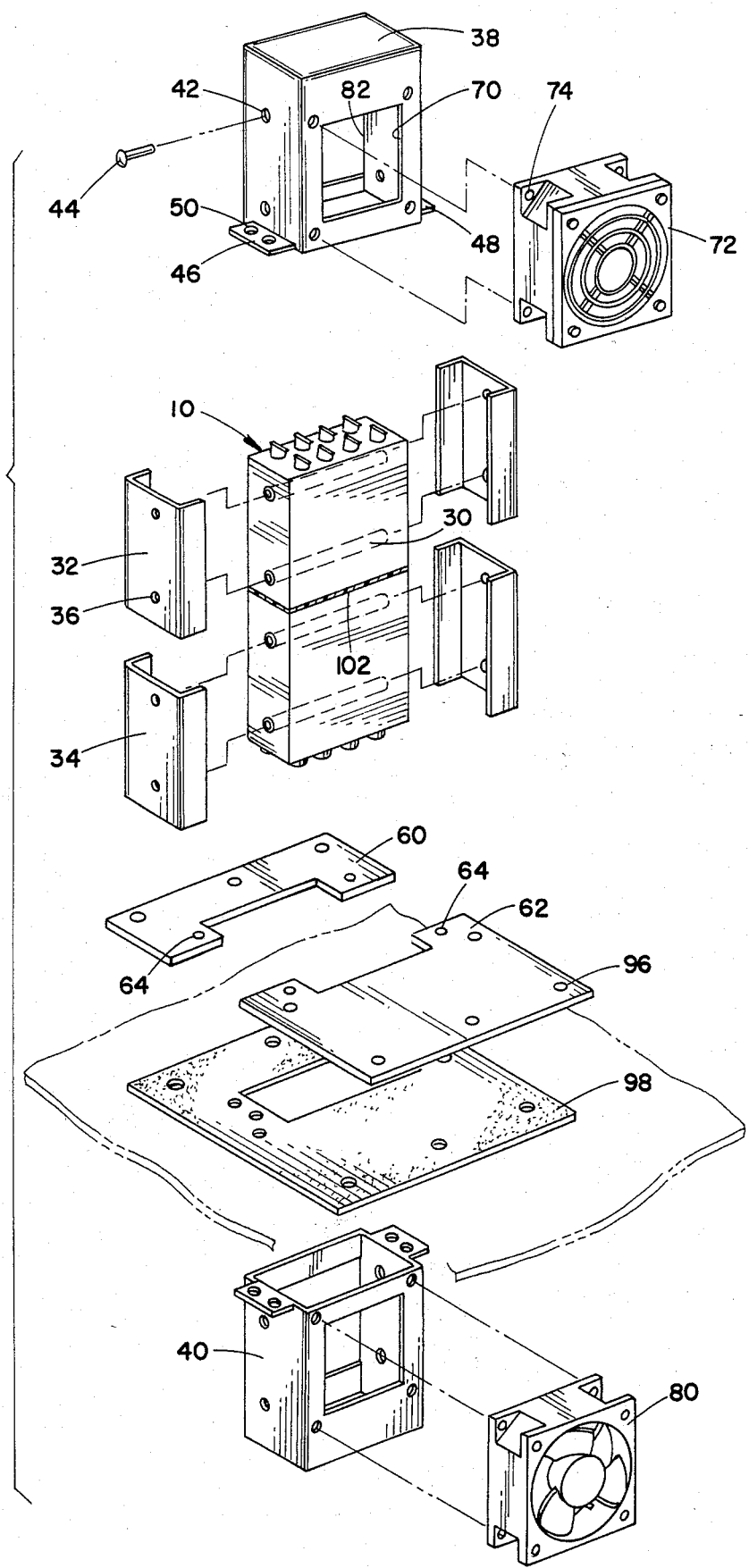
FIG. 4 is an exploded perspective view of the heat exchanger of FIG. 2.

With reference now also to FIG. 4, the heat pipe core 10 has positioned therein four spaced copper tubes 30 each of which is disposed horzliontally between two adjacent fins which are pushed apart for this purpose. Each tube 30 preferably has an outer diameter of ⅛ inches. These tubes are useful in the process of securing the heat pipe core to a plurality of identical fin brackets. Two fin brackets 32, 34 are positioned on each side of the heat pipe core. Since all four of the brackets are identical, only the two brackets on the left side of the core 10 will be discussed, it being appreciated that the two right side brackets perform the same function. Each bracket 32, 34 is provided with a pair of fastener apertures 36 which are suitably located on the brackets so that they are aligned with the tubes 30.

The heat pipe core 10 and the associated brackets 32, 34 are positioned within top and bottom fan shrouds 38, 40. These two fan shrouds are identical and, therefore, only the top fan shroud 38 will be described in detail. This fan shroud 38 is provided with suitable apertures 42 through which suitable conventional fasteners, such as pop rivets 44, can extend into the tubes 30 to secure the fin bracket 32 to the heat pipe core 10 and the fan shroud 38.

Figure 3:
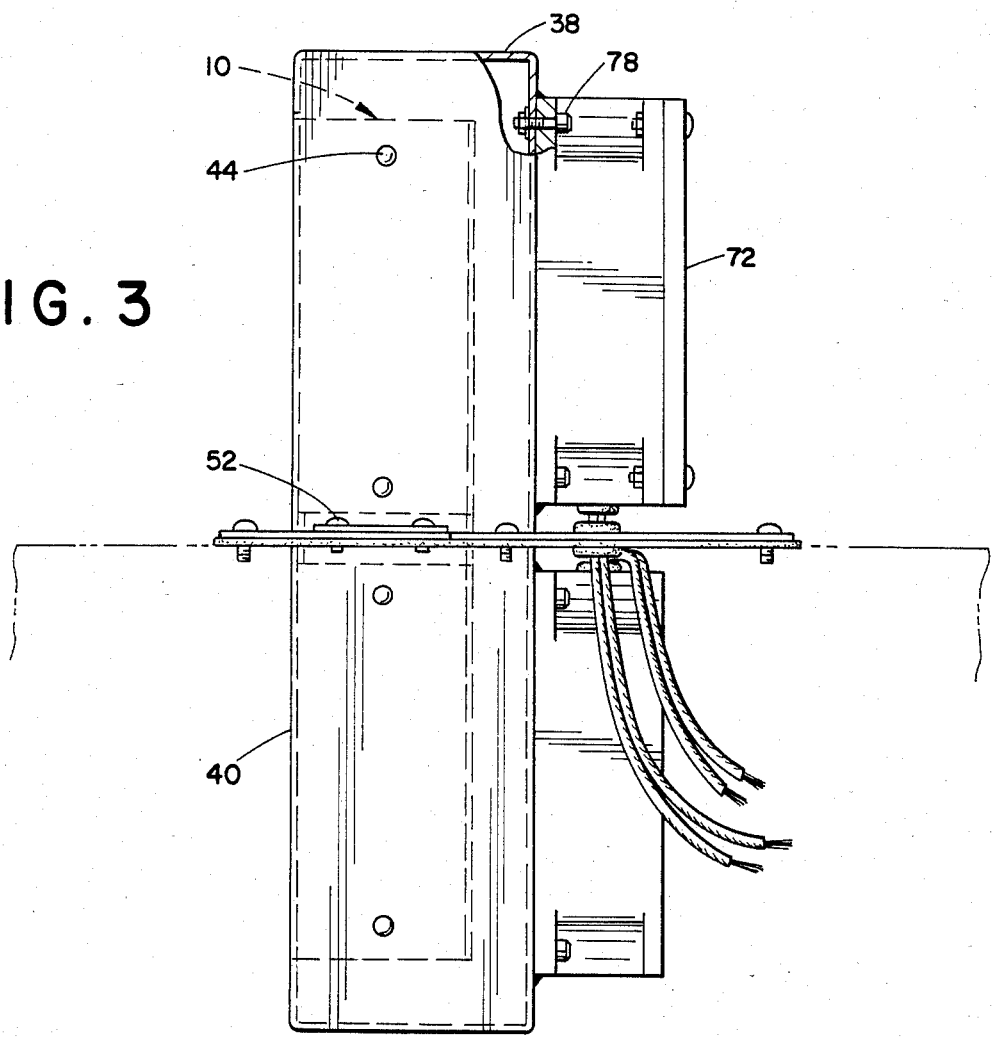
FIG. 3 is an enlarged side elevational view of the heat exchanger of FIG. 2.

Each fan shroud 38, 40 is provided with a pair of flanges 46, 48 each of which has one or more suitable apertures 50 provided therein. These apertures 50 are adapted to receive suitable fasterers 52 (see FIG. 3) to secure the respective shroud 38, 40 to support structure as will be described hereinbelow.

The two fan shrouds 38, 40 are secured to a pair of cooperating C-shaped flange members 60, 62 and to each other. The C flanges 60, 62 each have at least one aperture 64 which is located so it is colinear with the apertures 50 in the fan shroud flanges 46, 48. In this way, the fastener 52 can secure the fan shrouds to the C flanges and to each other. Hence, the heat pipe core 10 is also secured to the two flanges.

The upper fan shroud 38, 40 is provided with a suitable aperture 70 therein over which a suitable "muffin" fan or tubaxial fan 72 can be secured. The fan is provided on its corners with apertures 74 which are colinear with suitable apertures 76 provided on the fan shroud. In this way, conventional fasteners 78 can secure the fan to the fan shroud. The lower fan shroud 40 is also provided with a suitable fan 80 which is similarly secured thereto. Located opposite the fan shroud aperture 70 is a large aperture 82 to allow air to flow transversely through the fan shroud 38.

As mentioned, the two fan shrouds 38, 40 are secured to the two C flanges 60, 62. These, in turn, are secured to a box or enclosure member 90 (see FIG. 2) which is provided with a suitably sized opening 92 through which the heat pipe core 10 can extend. Also, the box member is provided with a plurality of apertures 94 which are colinear with apertures 96 provided in the C flanges 60, 62 so that fasteners 98 can secure the C flanges to the box member. A suitable gasket 100 can also be provided in connection with the C flanges. In this way, the C flanges 60, 62 can be secured to the box so that the gasket 100 is trapped therebetween. Also, an epoxy layer 102 (see FIG. 6) can be provided between two of the fins 14 at the height of the gasket 98. This serves to prevent any air circulation into and out of the box 90 to ensure that the entirety of the heat transfer between the box and the atmosphere will take place through the finned heat pipe core 10.

Figure 1:
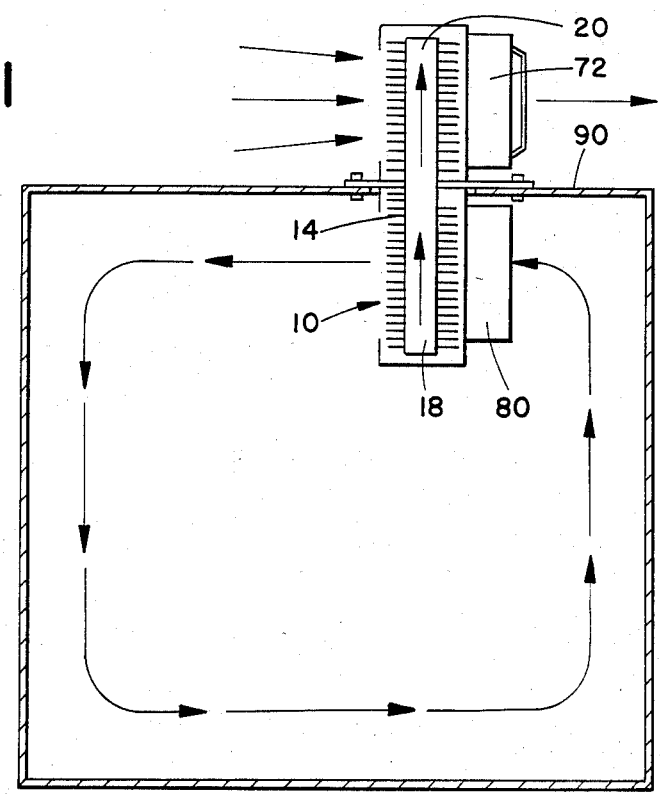
FIG. 1 is a schematic side elevational view of the heat exchanger assembly of the present invention in use.

With reference now to the schematic view of FIG. 1, it can be seen that the second fan 80 pulls heated air in the box 90 through a lower portion of the finned heat pipe core 10. This will vaporize the refrigerant fluid located in the evaporator end 18 of each heat pipe in the heat pipe core and cause it to move toward the condenser end 20 of the heat pipe. At the condenser ends, heat is transferred by means of a phase change in the fluid to the environment around the box. In other words, the second fan 80, i.e. the fan inside the box 90, blows air in the box toward the heat pipe core 10 and transfers heat to the fluid in each heat pipe by means of a phase change in the fluid from liquid to vapor. The vapor then rises in the heat pipe 12 until it is at a level outside the box 90. At this point, the first fan 72 pulls atmospheric air through the heat pipe core 10 thereby cooling the vapor back to a liquid and drawing heat out of the heat pipe assembly. As the vapor condenses, it gives up its latent heat of vaporization and returns to the liquid state in which it returns to the evaporator end of the heat pipe via capillary action along the wick lined walls of the pipe only to be heated and vaporized again continuing the heat transfer cycle.

The plurality of fins 14 provided in the heat pipe core 10 improve the air to pipe heat transfer while the fans improve the air flow.

It has been determined that since the "muffin" fans 72, 80 utilized in the present invention are rated for 30 watts each, the appropriate number of 2 inch by 5 inch fins needed per inch of heat pipe length is fourteen, in an arrangement utilizing eight heat pipes of approximately 11.25 inches in length extending through the fins. As mentioned, each of the fins is preferably approximately 0.008 inches in thickness.

Figure 7:
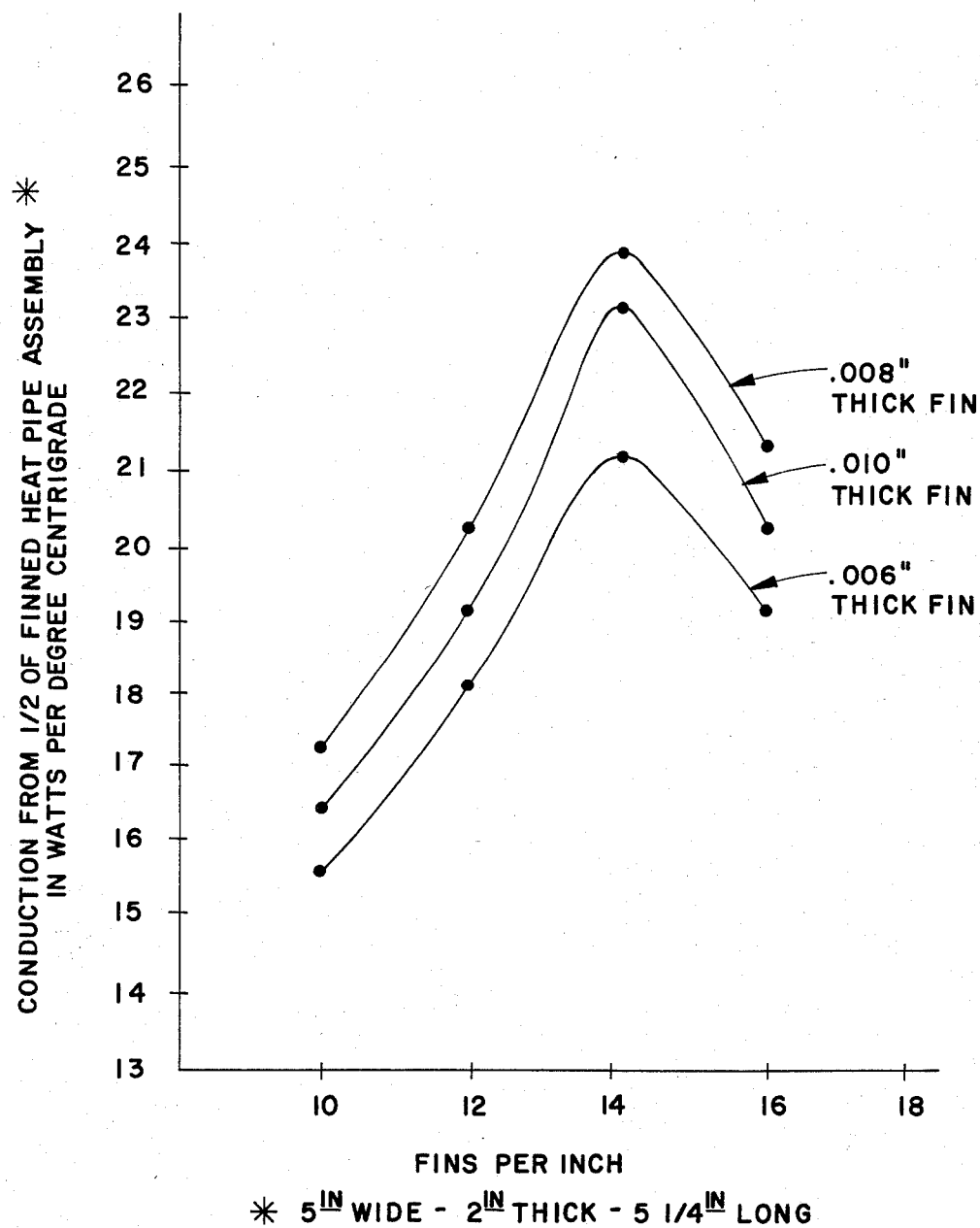
FIG. 7 is a graph showing the amount of heat conducted from the finned heat pipe core on the vertical axis, the number of fins provided per inch of heat pipe on the horizontal axis and the parameter of heat fin thickness; and, FIG. 8 is a graph showing the output pressure of the fan used with the finned heat pipe core on the vertical axis versus the capacity of the fan on the horizontal axis.

With reference now to FIG. 7, it has been empirically determined, after a considerable amount of testing, that to transfer the maximum amount of heat, in watts per degree centigrade, out of the enclosure when using the muffin fans 72, 80, fourteen fins of 0.008 inches in thickness each should be used per inch of heat pipe length. This will mean that 0.112 inches of each inch of heat pipe length will be covered by fins. Thus, air flow around the heat pipe and through the system can only take place in the remaining 0.888 inches. As one uses thicker fins, for example, moving from 0.006 inches to 0.008 inches, the fin coefficient, the resistance of the heat in the fin decreases and provides better performance. But, as fin thickness increases, the size of the channels between the fins, through which air can flow, decreases and as air flow is decreased the rate of heat transfer is also decreased.

When one increases the number of fins per inch from 10 to 12 to 14, fin area is added which causes a greater pressure drop and decreases the amount of air flow. But, the greater fin area provides an increased amount of heat transfer and up to a point this outweighs the lower air flow and decreased fan performance. Increases above fourteen fins per inch have been found to seriously affect fan performance, however, leading to a decrease of heat transfer. It has been found that muffin fans which are capable of moving approximately 100 cubic feet of air per minute (CFM) are advantageous since they do not cause as much noise as larger fans and yet still move an adequate amount of air.

Figure 8:
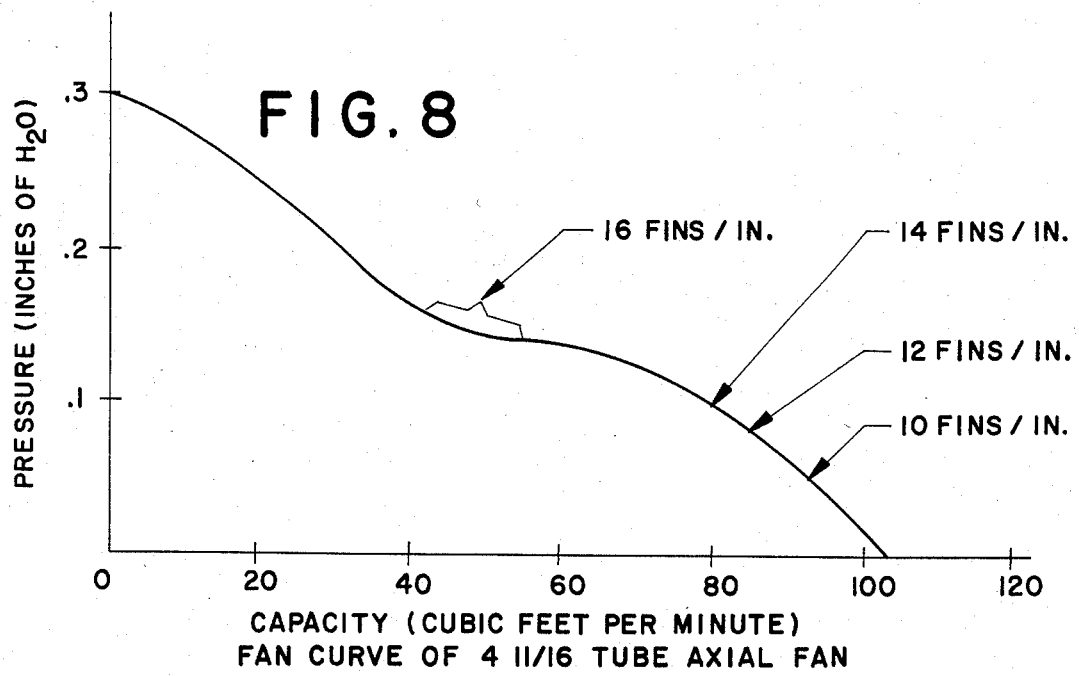

With reference now to FIG. 8, it can be seen that what happens to the flow rate of such a muffin fan when different numbers of 0.008 inch thick fins are put in the path of the fan's air flow. It is evident that up to fourteen fins per inch air flow is not degraded too seriously, approximately to 80 CFM (cubic feet per minute), but that past this point, at sixteen fins per inch, for example, air flow is strongly affected (as it decreases down to 40–50 CFM).

In summary, it has been found that the point of optimum operation for a fan on a particular finned heat pipe cooling system will be when the fan blows exactly the right amount of air through the system so as to transfer the maximum amount of heat. This involves a tradeoff between two concepts: (1) the greater the fin surface area provided, the more heat that can be transferred and (2) the smaller the air flow channels provided between the fins the greater the pressure drop across the fan and the lower the amount of air flow and hence the lower the amount of heat which can be transferred out of the system. The point of optimum operation for a 30 watt 100 CFM muffin fan has been found to occur when fourteen fins of 0.008 inch thickness each (and 2×5 inches in size) are provided per inch of heat pipe length. At this point of optimum operation, the finned heat pipe assembly is able to transfer more than 200 watts of heat when the temperature inside a closed cabinet is approximately 20° C. above the ambient temperature.

The invention has been described with reference to a preferred embodiment. Obviously, modifications and alterations will occur to others upon the reading and understanding of this specification. It is intended to include all such modifications and alterations insofar as they come within the scope of the appended claims or the equivalents thereof.

Having thus described the invention, it is now claimed:

1. A heat exchanger assembly for cooling the interior of a closed cabinet containing electronic components or the like, comprising:
    a finned heat pipe core including:
        a plurality of spaced heat pipes positioned in at least one row, a plurality of spaced fins which are provided with colinear apertures through which each of said plurality of heat pipes can extend, said heat pipes being secured to said fins;

affixing means for securing said finned heat pipe core to an associated cabinet; and, a pair of fans, one being operatively connected with each end of said finned heat pipe core, one of said fans, and an associated first end of said heat pipe core, being in contact with only the air inside said associated closed cabinet, the other of said fans and an associated second end of said finned heat pipe core being in contact with only the ambient air outside said associated cabinet, and wherein said fins have a spacing and a thickness which is sized to fit the performance curve of said fans wherein said fans each have a capacity of approximately 100 CFM (cubic feet per minute) and wherein said finned heat pipe core is optimized for said fans such that approximately fourteen fins are provided per inch of heat pipe length with each of said fins being approximately 0.008 inches in thickness, whereby said finned heat pipe core and said pair of fans are capable of transferring at least 200 watts of heat when the temperature inside said associated cabinet is approximately 20° C. above the ambient temperature.

2. The assembly of claim 1 wherein eight heat pipes are provided in said finned heat pipe core in two rows of four each, said two rows being offset from each other.

3. The assembly of claim 1 wherein the heat pipes are made from copper and said fins are made from aluminum.

4. The assembly of claim 2 wherein said heat pipes extend approximately 11 inches in length.

5. The assembly of claim 1 wherein said affixing means includes:

a container structure in which said finned heat pipe core is held and to which said two fans are secured;

a flange structure which is adapted to close an aperture in said associated container, said container structure being secured on said flange structure and a portion of said container structure and one of said fans being positioned inside said associated container; and, a plurality of fasteners for securing said flange structure to said associated container.

6. The assembly of claim 5 wherein said flange structure is approximately 5½ inches square and said container structure with said two fans is approximately 11½ inches long and 4¾ inches high.

7. The assembly of claim 5 further comprising seal means for sealing said associated cabinet and preventing air flow between ends of said heat pipes to prevent heat transfer between said associated cabinet and the environment except through said finned heat pipe core, said seal means including an epoxy layer.

8. The assembly of claim 5 wherein said container structure comprises:

a pair of generally U-shaped brackets, each of which is positioned adjacent to a respective side surface of said finned heat pipe core; and, a fastener means for securing said pair of brackets to said finned heat pipe core.

9. The assembly of claim 8 further comprising a tube extending transversely through said heat pipe core from one side surface to another side surface, said fastener means including a pair of rivet-like fasteners each of which extends into a respective end of said tube and secures a respective one of said brackets to said finned heat pipe core.

10. The assembly of claim 8 wherein said container structure further comprises a fan shroud to which said pair of U-shaped brackets are secured.

11. A heat exchanger assembly for cooling the interior of a closed cabinet containing electronic components or the like, comprising:

a finned heat pipe core including:

a plurality of spaced heat pipes positioned in at least two rows, each heat pipe having a condenser end and an evaporator end, a plurality of spaced heat sink fins which are provided with colinear apertures through which said plurality of heat pipes can extend, said plurality of heat pipes being secured to said plurality of fins:

container means for holding said finned heat pipe core, said container means having a first end which holds an evaporator end of each of said plurality of heat pipes and a second end which holds a condenser end of each of said plurality of heat pipes;

affixing means for securing said container means to an associated cabinet such that said heat pipe evaporator ends in said container means first end are positioned inside said cabinet;

first and second fans, each of which is secured to a respective first and second end of said container means, such that said first fan is positioned inside said associated cabinet along with said first container end, and said second fan and said second container end are positioned outside said associated cabinet; and, seal means for preventing the transfer of heat between said associated cabinet and its environment except through said finned heat pipe core, wherein said first and second fans are identical, are rated for approximately 30 watts each and have a capacity of approximately 100 CFM (cubic feet per minute), wherein said plurality of fins have a spacing and a thickness which is optimized for the performance curves of said fans such that approximately fourteen heat sink fins are provided per inch of heat pipe length with each of said fins being approximately 0.008 inches thick, and wherein eight heat pipes are provided on said finned heat pipe core, and wherein said finned heat pipe core and said first and second fans are capable of removing at least 200 watts of heat from said associated cabinet when the temperature inside said associated cabinet is at least 20° C. above the ambient temperature.

12. The assembly of claim 11 wherein said first fan blows air toward said finned heat pipe core and wherein said second fan blows air away from said finned heat pipe core.

13. A heat exchanger assembly for cooling the interior of a closed cabinet containing electronic components or the like, comprising:

a finned heat pipe core including:

a plurality of spaced heat pipes, each having a condenser end and an evaporator end, a plurality of spaced heat sink fins which are provided with colinear apertures through which said plurality of heat pipes can extend, said plurality of heat pipes being secured to said plurality of fins such that each fin is in thermal contact with each of said plurality of heat pipes;

mounting means for securing said finned heat pipe core to an associated closed cabinet such that said heat pipe evaporator ends are positioned inside said associated cabinet and said heat pipe condenser ends are positioned outside said associated cabinet;

a pair of identical fans, a first fan being operatively connected to said condenser end of each of said plurality of heat pipes, and a second fan being operatively connected to said evaporator end of each of said plurality of heat pipes, said heat pipe evaporator ends being in contact with only the air inside said associated closed cabinet and said heat pipe condenser ends being in contact only with the ambient air outside said associated cabinet; and, seal means for preventing air circulation between said cabinet and the environment thereby assuring that heat transfer occurs only through said finned heat pipe core, wherein said fins have a spacing and thickness which are sized to fit the performance curve of said fans, wherein fourteen heat fins are provided per inch of heat pipe length, with each of said fins being approximately 0.008 inches thick and wherein eight heat pipes each of which is approximately 11 inches in length are provided in said finned heat pipe core, said fins being optimized for said fans which are 30 watt fans having a capacity of approximately 100 CFM whereby said finned heat pipe core and said first and second fans are capable of removing at least 200 watts of heat from said associated cabinet when the temperature in said associated cabinet is at least 20° C. above the ambient temperature.

14. The assembly of claim 13 wherein said mounting means comprises:

a pair of generally U-shaped brackets, each of which is positioned adjacent a respective side surface of said finned heat pipe core;

a fan shroud which fits over said pair of brackets and to which at least one of said fans is secured; and, a plurality of fasteners which secure said pair of brackets to both said finned heat pipe core, and said fan shroud.

* * * * *